United States Patent
Kariya et al.

(10) Patent No.: US 7,773,388 B2
(45) Date of Patent: Aug. 10, 2010

(54) PRINTED WIRING BOARD WITH COMPONENT MOUNTING PIN AND ELECTRONIC DEVICE USING THE SAME

(75) Inventors: Takashi Kariya, Ogaki (JP); Toshiki Furutani, Ogaki (JP); Takeshi Kawanishi, Ogaki (JP)

(73) Assignee: Ibiden Co., Ltd., Ogaki (JP)

( * ) Notice: Subject to any disclaimer, the term of this patent is extended or adjusted under 35 U.S.C. 154(b) by 0 days.

(21) Appl. No.: 11/566,912

(22) Filed: Dec. 5, 2006

(65) Prior Publication Data
US 2007/0187140 A1 Aug. 16, 2007

(30) Foreign Application Priority Data
Dec. 9, 2005 (JP) .............................. 2005-356049

(51) Int. Cl.
*H01R 9/00* (2006.01)
(52) U.S. Cl. .................. 361/776; 361/761; 361/813; 439/66; 439/88
(58) Field of Classification Search ................ 351/776; 361/761, 776, 233, 813; 174/250; 257/414; 439/66, 88
See application file for complete search history.

(56) References Cited

U.S. PATENT DOCUMENTS

| | | | |
|---|---|---|---|
| 4,828,346 A | | 5/1989 | Jacobsen et al. |
| 5,491,301 A | * | 2/1996 | Akiba et al. ............... 174/250 |
| 5,495,667 A | | 3/1996 | Farnworth et al. .......... 29/843 |
| 5,635,750 A | * | 6/1997 | Schlaak et al. ............. 257/414 |
| 5,719,448 A | | 2/1998 | Ichikawa ................... 257/781 |
| 6,049,976 A | | 4/2000 | Khandros |
| 6,229,683 B1 | * | 5/2001 | Goodwin-Johansson .... 361/233 |
| 6,290,510 B1 | * | 9/2001 | Fork et al. .................. 439/81 |
| 6,324,067 B1 | * | 11/2001 | Nishiyama .................. 361/761 |
| 6,606,235 B2 | | 8/2003 | Chua et al. |
| 6,743,479 B2 | | 6/2004 | Kanoh et al. |

(Continued)

FOREIGN PATENT DOCUMENTS

JP 7-7263 1/1995

(Continued)

OTHER PUBLICATIONS

Kiyoshi Takagi, "Chapter 5 Process For Build-Up Multilayer Printed Wiring Board", Build-Up Multilayer Printed Wiring Board Technologies, Jun. 20, 2000, 15 pages (with extracted English translation).

(Continued)

*Primary Examiner*—Dean A. Reichard
*Assistant Examiner*—Andargie M Aychillhum
(74) *Attorney, Agent, or Firm*—Oblon, Spivak, McClelland, Maier & Neustadt, L.L.P.

(57) ABSTRACT

The present invention is to provide a printed wiring board in which malconnection or disconnection caused by a difference between coefficients of thermal expansion of a semiconductor chip and a printed wiring board can be decreased even when a highly-integrated semiconductor apparatus is mounted thereon and an electronic device using the same. An electronic device (4) according to the present invention includes a printed wiring board (1) with a component mounting pin (18) and a surface-mounting type semiconductor apparatus (2) with an electrode pad (3), wherein the component mounting pin (18) has elasticity and is urged against the electrode pad (3) to maintain electric connection.

20 Claims, 5 Drawing Sheets

U.S. PATENT DOCUMENTS

| | | | |
|---|---|---|---|
| 6,778,406 B2 * | 8/2004 | Eldridge et al. | 361/776 |
| 7,160,121 B2 | 1/2007 | Van Schuylenbergh et al. | |
| 7,230,440 B2 * | 6/2007 | Hantschel et al. | 324/762 |
| 7,297,413 B2 | 11/2007 | Mitsumori | |
| 7,530,814 B2 | 5/2009 | Ramaswamy et al. | |
| 7,553,165 B2 | 6/2009 | Mathieu et al. | |
| 2002/0164893 A1 * | 11/2002 | Mathieu et al. | 439/66 |
| 2003/0121698 A1 | 7/2003 | Kyougoku et al. | |
| 2003/0132027 A1 | 7/2003 | Maruyama et al. | 174/267 |
| 2005/0155706 A1 | 7/2005 | Nishida et al. | 156/312 |
| 2006/0040417 A1 | 2/2006 | Eldridge et al. | 438/14 |
| 2006/0139145 A1 | 6/2006 | Ono | 338/315 |
| 2006/0220234 A1 | 10/2006 | Honer et al. | 257/724 |
| 2009/0053910 A1 | 2/2009 | Kariya et al. | |

FOREIGN PATENT DOCUMENTS

| | | |
|---|---|---|
| JP | 7-326619 | 12/1995 |
| JP | 11-506829 | 6/1999 |
| JP | 2000-512437 | 9/2000 |
| JP | 2000-357762 | 12/2000 |
| JP | 2001-502851 | 2/2001 |
| JP | 2003-198068 | 7/2003 |
| JP | 2004-40138 | 2/2004 |
| JP | 2004-311919 | 11/2004 |
| JP | 2005-183466 | 7/2005 |
| KR | 1999-022385 | 3/1999 |
| KR | 2001-0012575 | 2/2001 |
| WO | WO 96/41506 | 12/1996 |
| WO | WO 98/50953 | 11/1998 |
| WO | WO 98/052224 | 11/1998 |
| WO | WO 98/52224 | 11/1998 |
| WO | WO 99/18445 | 4/1999 |
| WO | WO 2007/066563 A1 | 6/2007 |
| WO | WO 2007/066564 A1 | 6/2007 |

OTHER PUBLICATIONS

U.S. Appl. No. 11/566,862, filed Dec. 5, 2006, Kariya, et al.
U.S. Appl. No. 11/566,912, filed Dec. 5, 2006, Kariya, et al.
U.S. Appl. No. 11/566,847, filed Dec. 5, 2006, Kariya, et al.
U.S. Appl. No. 11/566,912, filed Dec. 5, 2006, Kariya, et al.
U.S. Appl. No. 11/566,912, filed Dec. 5, 2006, Patent App. Publication No. 2007-0187140, filed Aug. 2007, Kariya et al.
U.S. Appl. No. 12/254,592, filed Oct. 20, 2008, Patent App. Publication No. 2009-0053910, filed Feb. 2, 2009, Kariya et al.

* cited by examiner

PRINTED WIRING BOARD WITH COMPONENT MOUNTING PIN AND ELECTRONIC DEVICE USING THE SAME

BACKGROUND OF THE INVENTION

1. Field of the Invention

The present invention relates to a printed wiring board with a component mounting pin and an electronic device using the same, and more particularly to a printed wiring board with a component mounting pin for use in mounting surface-mounting type parts and an electronic device using the same.

2. Description of the Related Art

A number of electronic components (e.g. semiconductor apparatus such IC and LSI) are employed to fabricate electronic apparatus. A printed wiring board is used to electrically connect electrode pads of these semiconductor apparatus. Since it is inevitable that highly-integrated semiconductor apparatus includes a large number of electrodes, in order to mount such semiconductor apparatus on a printed wiring board with a limited area, it is customary that a flip-chip mounting system is used to mount the electrode pads of the semiconductor chip on the printed wiring board in such a manner that their surfaces are opposed to the printed wiring board to thereby connect the electrode pads to the lands of the printed wiring board mounting surface by a suitable technology such as solder bump.

In the document of the present application, "printed wiring board" refers to a board with a wiring pattern formed on an insulating substrate, and "printed circuit board" refers to a component product in which electronic components such as IC and LSI are mounted on the printed wiring board. The printed circuit board is a component product of an electronic component with predetermined objects and therefore referred to as an "electronic device".

[Patent Document 1]: Japanese Patent Laid-open Publication No. 2005-183466 "MULTILAYER PRINTED WIRING BOARD" (published on Jul. 7, 2005).

The Background Art of the Patent Document 1 has described a flip-chip mounting system printed circuit board using suitable technology such as solder bump in which a solder resist layer 70 is formed on an upper layer of a via hole 160 and a conductor circuit 158, bumps 76U and 76D being formed on the via hole 160 and the conductor circuit 158 through an opening portion 71 of the solder resist layer 70. An IC chip, not shown may be electrically connected to the printed circuit board by C4 (flip-chip) mounting.

However, the above Patent Document 1 fails to mention a printed wiring board with a component mounting pin disclosed in the present application.

SUMMARY OF THE INVENTION

On the other hand, as integration degree of semiconductor apparatus is increasing more in recent years, a chip size thereof also is becoming enormous. If an electronic device in the mounting state in which an electrode pad of an electronic component (e.g. semiconductor chip) of a gigantic size and a land of a printed wiring board are soldered is exposed to rise and fall of an ambient temperature, then there is the possibility that a soldered portion will be broken due to a difference between coefficients of thermal expansion of the electronic component and the printed wiring board.

Therefore, a demand of developing a printed wiring board in which malconnection or disconnection caused by a difference between the coefficients of thermal expansion of the electronic component and the printed wiring board can be decreased even when a highly-integrated semiconductor chip is mounted thereon has increased so far.

In view of the aforesaid aspects, the present invention intends to provide a printed wiring board in which malconnection or disconnection caused by a difference between the coefficients of thermal expansion of an electronic component and a printed wiring board can be decreased even when a highly-integrated electronic component is mounted thereon.

Further, the present invention intends to provide an electronic device in which malconnection or disconnection caused by a difference between the coefficients of thermal expansion of a semiconductor chip and a printed wiring board can be decreased even when a highly-integrated electronic component is mounted thereon.

In the light of the above matters, a printed wiring board of the present invention includes component mounting pin.

Further, in the printed wiring board, said component mounting pin may be elongated from an outermost conductor of said printed wiring board and the other end thereof may be erected from said printed wiring board.

Further, in the printed wiring board, said component mounting pin may be made of an elastic material.

Further, in the printed wiring board, said component mounting pin may be made of a material with low electric resistance.

Further, in the printed wiring board, said component mounting pin may be made of any material selected from a group consisting of a metal, a conductive rubber, a partly-conductive rubber, a conductive synthetic resin and a partly-conductive synthetic resin.

Further, in the printed wiring board, said component mounting pin may be formed of films of n layers ($n \geq 2$) and a film of a first layer is easy to expand relative to a film of an nth layer where a film located on the side opposing to said printed wiring board is expressed as $n=1$.

Further, in the printed wiring board, stress of an $n-1$th layer may be tensile stress relative to stress of said nth layer or it is equal to the stress of said nth layer, and stress of said first layer may be tensile stress relative to the stress of said nth layer.

Further, in the printed wiring board, said $n-1$th layer may have an equal or higher coefficient of thermal expansion to or than that of thermal expansion of said nth layer, and said first layer may have a higher coefficient of thermal expansion than that of thermal expansion of said nth layer.

Further, in the printed wiring board, said component mounting pin may have a conductive protective coating formed thereon.

Further, in the printed wiring board, said component mounting pin may have a solder bump formed at its tip end portion.

Further, an electronic device of the present invention comprises: a printed wiring board with a component mounting pin; and a surface-mounting type component with an electrode pad, wherein said component mounting pin is electrically connected to said electrode pad.

Further, in the electronic device, said component mounting pin may have elasticity and may be urged against said electrode pad.

Further, in the electronic device, said component mounting pin may be short in length.

Further, in the electronic device, said component mounting pin may be elongated from an outermost conductor of said printed wiring board, erected upward and connected to said electrode pad and the portion in which said component mounting pin may be erected upward is enclosed by the air.

Further, an electronic device of the present invention comprises: a printed wiring board with a component mounting pin; and a surface-mounting type component with an electrode pad, wherein said component mounting pin has a solder bump formed at its tip end portion and is soldered to said electrode pad.

According to the present invention, it is possible to provide a printed wiring board in which malconnection or disconnection caused by a difference between the coefficients of thermal expansion of an electronic component and a printed wiring board can be decreased even when a highly-integrated electronic component is mounted thereon.

Further, according to the present invention, it is possible to provide an electronic device in which malconnection or disconnection caused by a difference between the coefficients of thermal expansion of an electronic component and a printed wiring board can be decreased even when a highly-integrated electronic component is mounted thereon.

EXPLANATION OF REFERENCE NUMERAL

1:printed wiring board, 2:semiconductor apparatus (IC, LSI, etc.), 3:electrode pad, 4:electronic device, 5:filled via, 10:insulating layer, 11:outermost layer conductor, conductive land, 12:solder resist layer, 12a:opening, 13:dry film, 13a:opening, 14:Sn layer, 16:first plating layer, 17:second plating layer, 18:component mounting pin, 20:etching resist,

DESCRIPTION OF THE PREFERRED EMBODIMENTS

A printed wiring board and an electronic device using the same according to the embodiments of the present invention will be described below in detail with reference to the accompanying drawings, wherein identical elements and parts are denoted by identical reference numerals and therefore need not be described.

[Arrangements of Printed Wiring Board with Component Mounting Pin and Electronic Device Using the Same]

(Printed Wiring Board with Component Mounting Pin)

Figure 1:
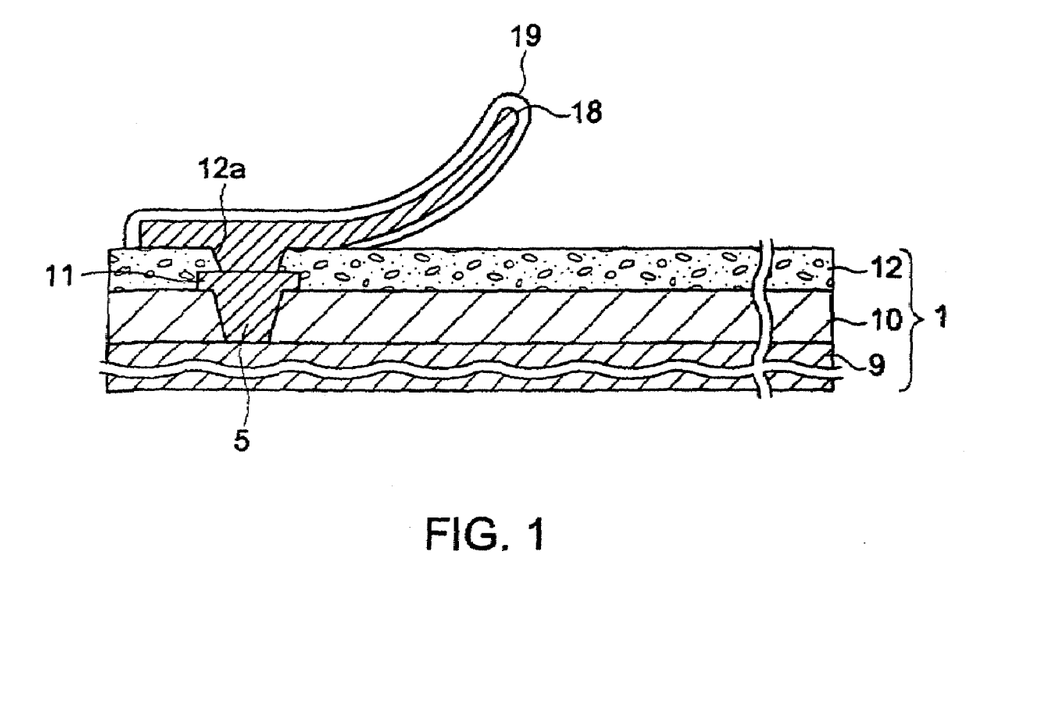
FIG. 1 is a diagram showing part of an arrangement of a printed wiring board with a component mounting pin.

FIG. 1 of the accompanying drawings is a diagram showing part of a printed wiring board with a component mounting pin. A printed wiring board 1 according to the embodiment of the present invention includes a component mounting pin 18 to connect with an electronic component (not shown) like a semiconductor apparatus such as an IC and an LSI.

The printed wiring board 1 with a component mounting pin according to the embodiment of the present invention is characterized by the component mounting pin 18 electrically connected to an outermost conductor 11. Accordingly, a rest of the arrangement of the printed wiring board 1 can be changed freely. Since the embodiment of the present invention is characterized by the outermost conductor, the printed wiring board 1 will be described such that an insulating layer 10 with the outermost layer conductor 11 formed thereon, a solder resist layer 12 formed on the insulating layer 10 and other layer 9 formed under the insulating layer 10, each of which comprises the printed wiring board 1, will be highlighted separately in order to understand the present embodiment more clearly.

For example, the printed wiring board 1 includes the solder resist layer 12 with an opening 12a and the substrates 9 and 10. The substrate 10 is the insulating layer formed under the solder resist layer 12 and the substrate 9 is composed of a predetermined conductive layer and an insulating layer. The insulating layer 10 has a filled via hole 5 and the upper portion of the filled via hole 5 is formed as the outermost conductor 11.

One end of the component mounting pin 18 is electrically connected to the outermost conductor 11 and the other end thereof is erected upward from the printed wiring board 1. The component mounting pin 18 might be covered with a desired conductive protective coating 19 if necessary. The printed wiring board 1 is connected to a semiconductor apparatus (not shown) by this component mounting pin 18.

The component mounting pin 18 is made of a material having suitable properties such as flexibility, elasticity and pliability and should preferably be made of a material with low electric resistance in addition to flexibility, elasticity and pliability. This elastic material, for example, might be any material selected from a group consisting of metal, conductive rubber, partly-conductive rubber, conductive synthetic resin and partly-conductive synthetic resin.

The component mounting pin 18 might be formed of films of n layers (n≧2 wherein a first layer is assumed to be disposed on the side opposing to the printed wiring board 1). If the film of the nth layer is easy to contract relative to the film of the first layer, the film of the nth layer need not contract relative to a film of an n−1th layer. The above film arrangement may be provided by suitable methods such as to cause the film of the nth layer to be under compressive stress relative to the film of the first layer and to cause the film of the nth layer to have a lower coefficient of thermal expansion than a coefficient of thermal expansion of the film of the first layer.

Then, the film of the n−1th layer may be under tensile stress relative to the film of the nth layer or the film of the n-th layer may be without tensile stress or compressive stress relative to the film of the nth layer. Also, the film of the n−1th layer may have a higher coefficient of thermal expansion than a coefficient of thermal expansion of the film of the nth layer or the film of the n-th layer may have an equal coefficient of thermal expansion to a coefficient of thermal expansion of the film of the nth layer. The film of the second layer may be under compressive stress relative to the film of the first layer, the film of the third layer may be under compressive stress relative to the film of the second layer, . . . , the film of the nth layer may be under compressive stress relative to the film of the n−1th layer. Also, coefficients of thermal expansion of the respective layers can be lowered progressively from the first layer to the nth layer.

[Method of Mounting Electronic Device Using Printed Wiring Board with Component Mounting Pin]

Figure 2:
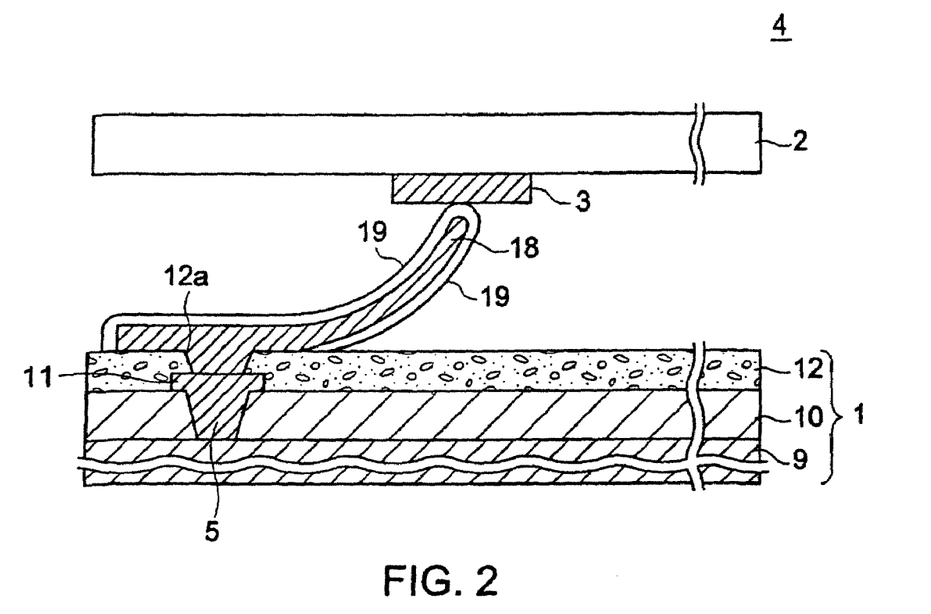
FIG. 2 is a diagram showing part of an electronic device using a printed wiring board with a component mounting pin.

FIG. 2 is a diagram showing part of the electronic device 4 using the printed wiring board 1 with the component mounting pin 18, revealing the mounting structure. As shown in FIG. 2, the component mounting pin 18 of the printed wiring board 1 mechanically contacts with the electrode pad 3 formed on the electronic component 2 like the semiconductor apparatus such as IC and LSI to maintain electric connection between it and the electronic component 2.

The printed wiring board 1 and the semiconductor apparatus 2 might be fixed to each other by any method. Although not shown, both of the printed wiring board 1 and the semiconductor apparatus 2 may be fixed to a casing of the electronic device, for example. Alternatively, both of the printed wiring board 1 and the semiconductor apparatus 2 may be fixed to each other by adhesive such as resin.

This electronic device 4 is characterized in that a member to connect the electronic component 2 and the printed wiring board 1 is changed from the related-art solder bump (not shown) to the component mounting pin 18.

Since the component mounting pin 18 has suitable properties such as flexibility, elasticity and pliability, when the component mounting pin 18 is pressed against the electrode pad 3, it can assure electric connection between the semiconductor apparatus 2 and the printed wiring board 1. Further, the component mounting pin 18 is a machine element that can absorb force (mechanical energy) applied to either of or both of the semiconductor apparatus 2 and the printed wiring board 1 by either elasticity or deformation. As a result, it is possible to decrease malconnection or disconnection caused by a difference between coefficients of thermal expansion of the semiconductor apparatus 2 and the printed wiring board 1.

While the size of the printed wiring board 1 is 30 to 70 mm squares, for example, it may be not limited thereto and can be changed freely. The size of the semiconductor apparatus 2 mounted on the printed wiring board 1 is 10 to 30 mm squares, for example. One semiconductor apparatus 2 is provided with electrode pads with 3,000 to 20,000 attachment points. In particular, the embodiment of the present invention is suitable for mounting an electronic component including electrode pads with 10,000 to 20,000 attachment points. Although it is customary to mount one semiconductor apparatus 2 on one printed wiring board 1, even when two or three semiconductor apparatus is mounted on the semiconductor apparatus in an MCM (Multichip module) packaged fashion, the component mounting pin 18 is able to decrease malconnection or disconnection caused by a difference between coefficients of thermal expansion.

Further, the component mounting pin 18 is very short and it is able to obtain excellent electric characteristics from standpoints of matching of characteristic impedance $Z_0$ and increasing a propagation speed of an electric signal. Similarly, when the component mounting pin 18 is made of a material with low electric resistance, it is possible to avoid useless voltage drop. For example, this is the case in which the component mounting pin 18 may be made of Cu (copper), Au (gold), Ag (silver) or alloy of any combination thereof or the component mounting pin 18 may be surface-finished by these metals.

Further, since the component mounting pin 18 is erected upward from the printed wiring board 1, it can be enclosed with the air so that a signal can be transmitted at a higher speed.

Further, when the component mounting pin 18 is brought in mechanical contact with the electrode pad 3 under force of repulsion, it is possible to maintain electric connection between the semiconductor apparatus 2 and the printed wiring board 1 satisfactorily.

Further, since the printed wiring board 1 with the component mounting pin 18 according to the embodiment of the present invention is characterized by the component mounting pin 18 electrically connected to the outermost conductor 11, other portions of the printed wiring board 1 can be changed freely and the present embodiment can be applied to large-sized printed wiring boards and coreless substrates which are easy to warp, etc.

Furthermore, since the semiconductor apparatus 2 and the printed wiring board 1 are connected not by soldering but by mechanical contact made by the component mounting pin 18, the present embodiment has a merit that thermal budget such as reflow will not be left.

Figure 3:
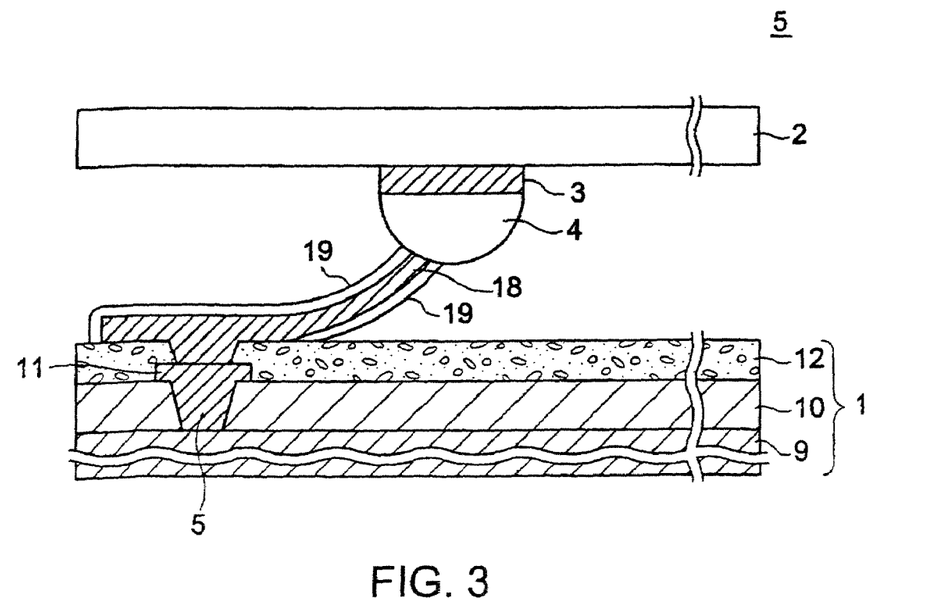
FIG. 3 is a diagram showing part of an electronic device in which electric connection is maintained between the component mounting pin of the printed wiring board and the electronic component by soldering.

FIG. 3 is a diagram showing part of the electronic device 5 in which electric connection is maintained between the component mounting pin 18 of the printed wiring board 1 and the semiconductor apparatus 2 by soldering and reveals the mounting structure. If requested, the component mounting pin 18 of the printed wiring board 1 may include the solder bump 4 formed at its tip end potion and the component mounting pin 18 and the electrode pad 3 of the semiconductor apparatus 2 are connected by soldering through solder reflow in a state of having the electrode pad 3 mechanically brought in contact with the semiconductor apparatus 2 as shown in FIG. 2. Further, if requested, the printed wiring board 1 and the semiconductor apparatus 2 may be fixed to each other by the above-mentioned method.

[Manufacturing Method Printed Wiring Board with Component Mounting Pin]

A typical example of a method of manufacturing a printed wiring board with a component mounting pin will be described with reference to FIGS. 4A to 4M in conjunction with a method using plating (plating method).

Since this manufacturing method is characterized by a component mounting pin using an outermost conductor 11, other portions (see reference numerals 9 and 10 in FIGS. 1 to 3) than the outermost conductor 11 were already formed.

Further this application will explain the typical example of a method of manufacturing a printed wiring board with a component mounting pin 18. Concerning the details of method of manufacturing a printed wiring board with a component mounting pin, refer to the patent application (assignee reference number: PB030) filed on the same date as this application.

Other portions 9 and 10 than the outermost conductor 11 were already formed by a well-known build-up method. With respect to such printed wiring board manufacturing method, refer to Japanese Patent Laid-open Publication No. 2004-40138 "BUILD-UP MULTILAYER PRINTED WIRING BOARD" (published on Feb. 5, 2004) and Japanese Patent Laid-open Publication No. 2004-311919 "THROUGH-HOLE FILL METHOD" (published on Nov. 4, 2004). With respect to the build-up manufacturing method, refer to "BUILD-UP MULTILAYER PRINTED WIRING BOARD TECHNOLOGY" written by Kiyoshi Takagi, published by THE NIKKANKOGYO SHINBUN, LTD., on Jun. 20, 2000.

From the foregoing, it is to be appreciated that other elements and parts than the outermost conductor 11 are omitted from the description of the following manufacturing method.

Figure 4A:
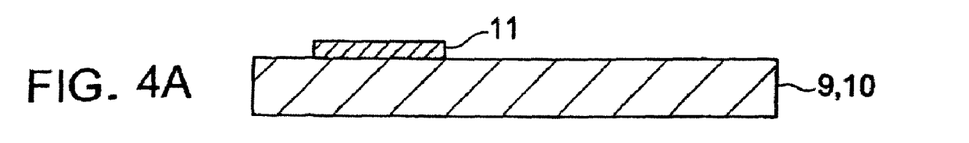
FIGS. 4A to 4L are respectively diagrams showing respective steps of a method of manufacturing a printed wiring board with a component mounting pin.

FIG. 4A is a diagram showing a process for preparing a substrate (portions other than the outermost conductor) 9, 10. The substrates 9 and 10 are composed of printed wiring boards in which portions other than the outermost conductor 11 are formed. The outermost conductor 11 is formed by a fill-additive method, a semi-additive method or by a subtractive method. A semiconductor device connection land having a thickness of 20 μm, a diameter (diameter of conductive land) of 150 μm and a minimum pitch (distance between the adjacent conductive lands) of 200 μm is formed as this outermost conductor 11. Placement of the conductive land 11 is such one that a central portion is a lattice-like placement, an outer peripheral portion being a random placement. The number of the conductive land 11 amounts to approximately 50×40. Such conductive land group is formed within an area of about 150 square mm at the outermost layer of the printed wiring board.

Figure 4B:
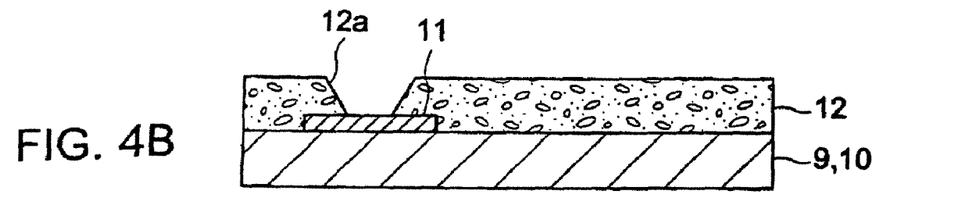

FIG. 4B is a diagram showing a process for forming a solder resist layer. As shown in FIG. 4B, a solder resist layer 12 is coated on the conductive land 11 by screen printing and an opening portion 12a is formed on the solder resist layer 12. Alternatively, a semi-cured insulating film may be attached to the substrate 9, 10 and the opening portion 12a may be formed on the insulating film by using laser light or the like after the insulating film was cured.

Figure 4C:
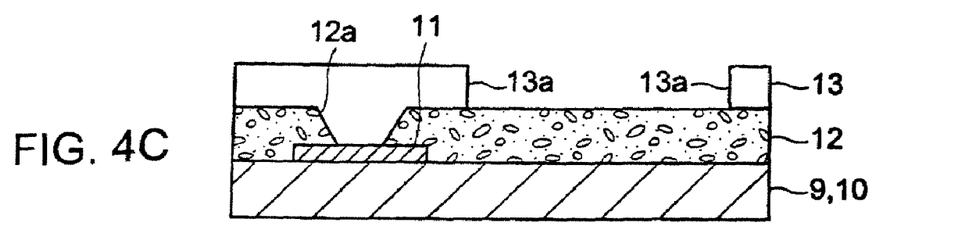

FIG. 4C is a diagram showing a process in which a resist is laminated, exposed and developed. As shown in FIG. 4C, a dry film 13, for example, is laminated on the solder resist layer 12 and an opening portion 13a is formed on the dry film 13 by exposure and development. The opening portion 13a is formed on the dry film 13 at the proper position so as not to overlap with the opening portion 12a on the solder resist layer 12 in the thickness direction.

Figure 4D:
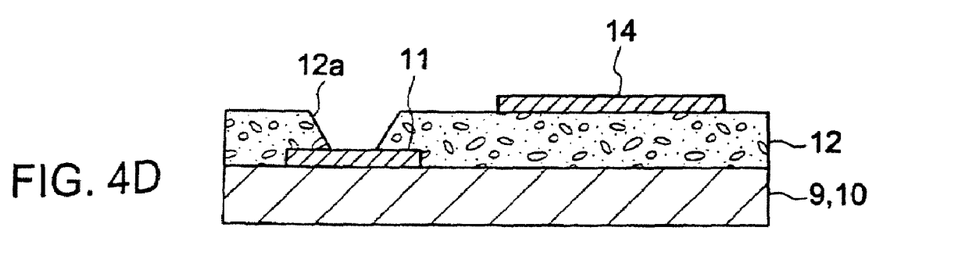

FIG. 4D is a diagram showing a process in which a Sn (tin) layer is formed. As shown in FIG. 4D, a Sn layer 14, for example, is deposited on the solder resist layer 12 of the bottoms of the dry film 13 and the opening portion 13a by sputtering. After that, the dry film 13 is removed from the solder resist layer 12. As a result, only the Sn layer 14 is left on the solder resist layer 12 of the bottom of the opening portion 13a. This Sn layer 14 is partly removed by an etching process shown in FIG. 4K and therefore referred to as a "sacrificial layer".

Thereafter, a catalytic nucleus (not shown) for use in electroless plating is given to the resultant product. Noble metal ion and noble metal colloid (e.g. palladium chloride and palladium colloid) may be typically used as an electroless plating catalytic nucleus.

Figure 4E:
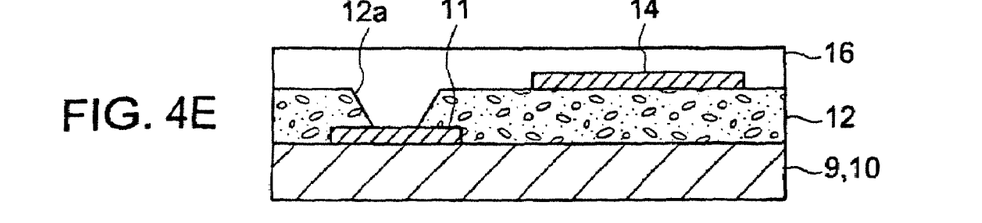

FIG. 4E is a diagram showing a process for forming a first plated layer. A first plating layer 16 may be typically formed by electroless copper plating. Preferably, in order that the deposited first plating layer 16 may become easy to expand with tensile stress, an electroless plating bath may employ tartaric acid as a complexing agent and it may further contain at least one kind of metal ions as an additive. The first plating layer is believed to be under tensile stress by suppressing hydrogen from being generated.

Figure 4F:
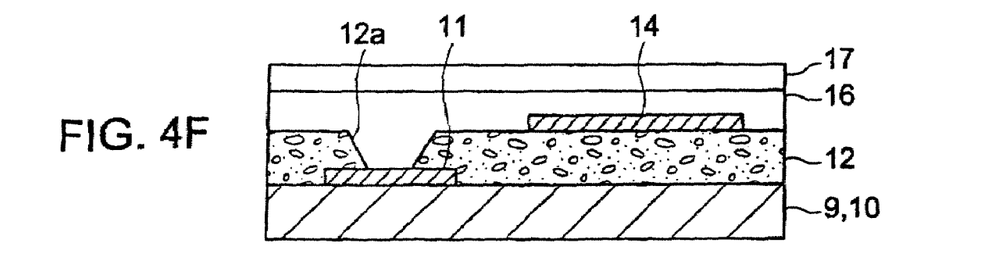

FIG. 4F is a diagram showing a process for forming a second plating layer. A second plating layer 17 may be typically formed by electroless copper plating. Preferably, in order that the deposited second plating layer 17 may become easy to contract with compressive stress, this electroless plating bath may contain EDTA (ethylenediaminetetracetic acid) as a complexing agent and the second layer 17 may contain a large quantity of hydrogen.

As a result, a bilayer structure consisting of the first plating layer 16 which is easy to expand with tensile stress and the second plating layer 17 which is easy to contract with compressive stress are formed on the solder resist layer 12. This bilayer structure will be formed as the component mounting pin 18 (see FIG. 1) through the subsequent processes.

Figure 4G:
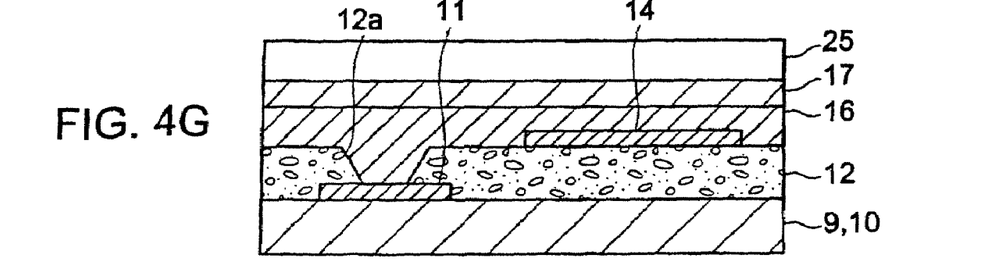

FIG. 4G is a diagram showing a process for laminating an etching resist. For example, a dry film 25 is laminated on the second plating layer 17.

Figure 4H:
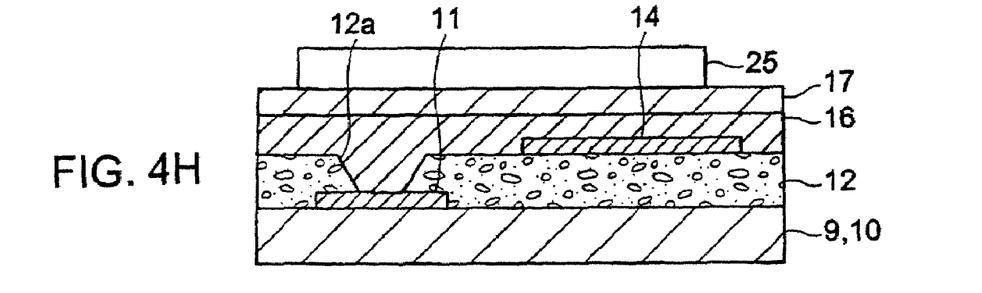

FIG. 4H is a diagram showing a process for exposing and developing the etching resist 25. According to this process shown in FIG. 4H, there is formed the etching resist 25 for use with the next etching process.

Figure 4I:
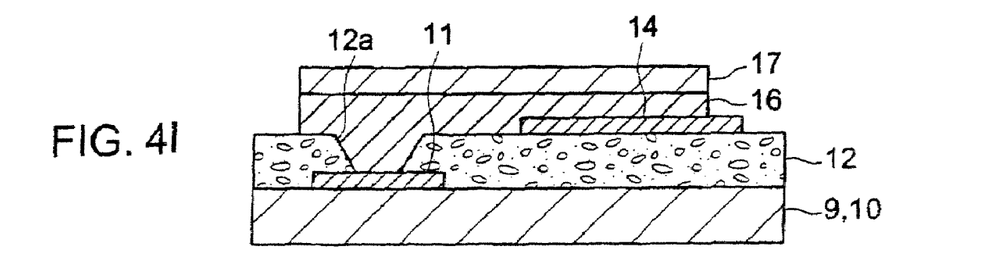

FIG. 4I is a diagram showing an etching process for etching the first and second plating layers 16 and 17. As shown in FIG. 4I, the etching resist 25 is used to etch the first and second electroless plating layers 16 and 17, each of which is the electroless plating layer, to form a conductive land (pattern). Thereafter, the etching resist 25 is stripped from the second plating layer 17.

Figure 4J:
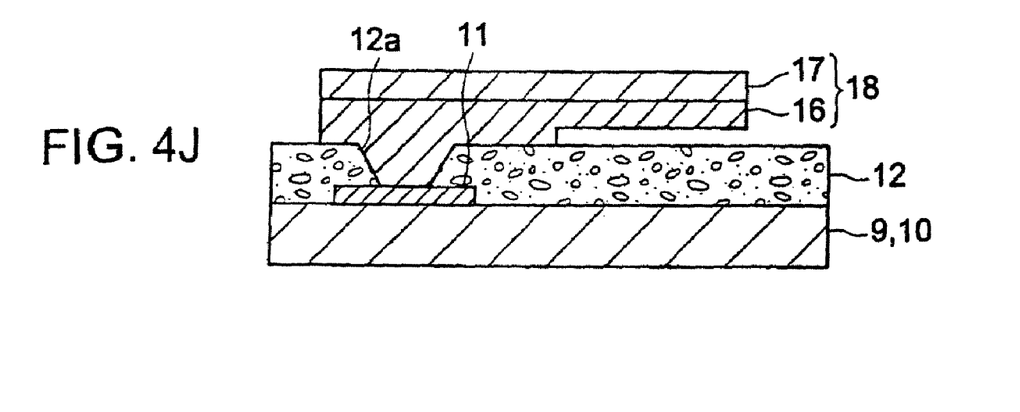

FIG. 4J is a diagram showing an etching process of the Sn layer 14. As shown in FIG. 4J, the Sn layer 14 located under the first plating layer 16 is partly etched away by using a Sn stripping agent.

Figure 4K:
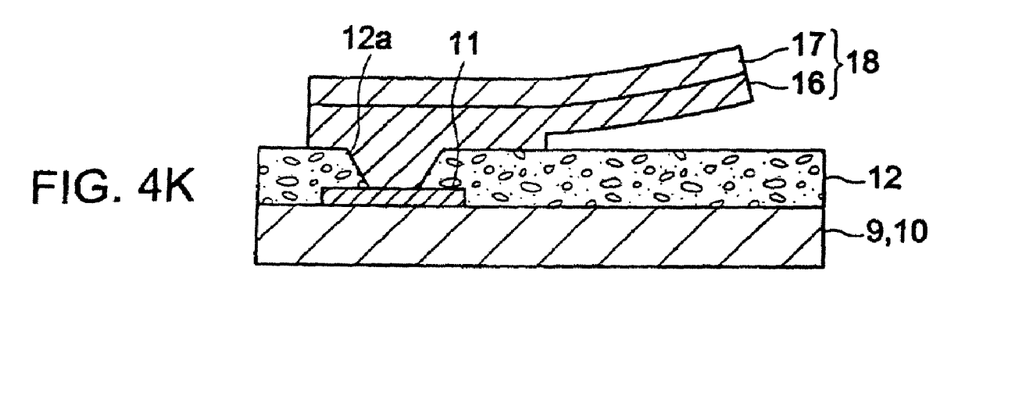

FIG. 4K is a diagram showing a process for forming a component mounting pin. As shown in FIG. 4K, the Sn layer 14 located under the first plating layer 16 is removed and thereby the component mounting pin 18 is formed. Since this component mounting pin 18 is formed by the bilayer structure composed of the first plating layer 16 which is easy to expand with tensile stress and the second plating layer 17 which is easy to contract with compressive stress, the first plating layer 16 expands and the second plating layer 17 contracts to cause this component mounting pin 18 to erect upward.

Figure 4L:
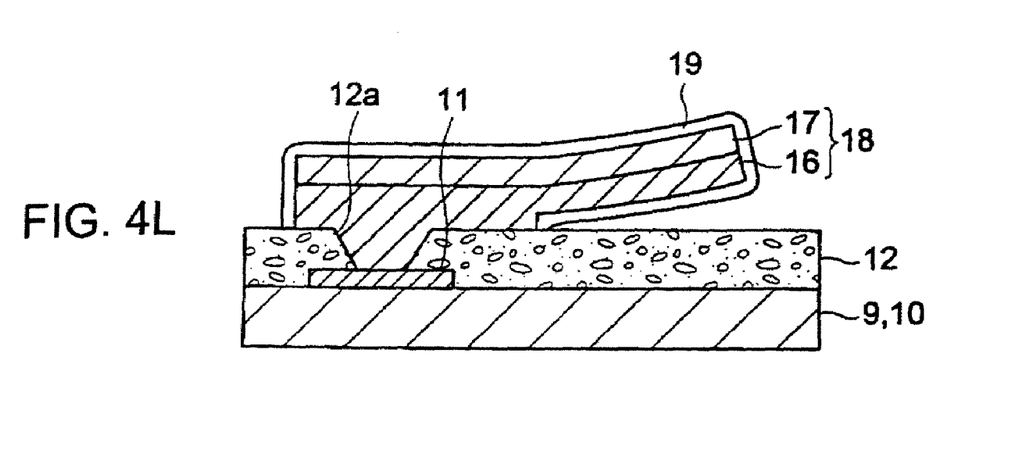

FIG. 4L is a diagram showing a process for forming a protective film. As shown in FIG. 4L, a desired protective film (coating) 19 is formed on the component mounting pin 18 if necessary. Either a coating of a single layer or coatings of a plurality of layers selected from Ni, Au, Cu, Pd/Sn and the like may be formed as this coating by using plating, for example.

EFFECT OF THE EMBODIMENTS

The following effects can be achieved by the above-described embodiments.

(1) Decrease of malconnection or disconnection caused by a difference between coefficients of thermal expansion of the semiconductor chip and the printed wiring board:

Since the semiconductor chip and the printed wiring board are connected by the component mounting pin with suitable properties such as flexibility, resiliency and pliability (mechanically joined under repulsive force of the component mounting pin), the component mounting pin is able to absorb shearing stress caused by an expansion difference generated depending on a temperature at which it is exposed so that too large stress can be prevented from being concentrated on the solder connected portion, thereby suppressing the connected portion from being either damaged or broken.

This component mounting pin is able to absorb stress generated from every direction of 360 degrees. As a result, it is possible to provide a printed wiring board in which malconnection or disconnection caused by a difference between coefficients of thermal expansion of the semiconductor chip and the printed wiring board can be decreased.

(2) Excellent electric characteristics:

Since the semiconductor chip and the printed wiring board are connected by the component mounting pin using the pattern of the printed wiring board, the connection length is shortened inevitably and thereby excellent electric characteristic can be obtained. For example, in an electronic device (i.e. multichip module) in which a plurality of semiconductor bear chips are mounted on a single printed board, a component mounting pin of which length is extremely short is formed on a microstrip line of a printed wiring board designed so as to provide a constant characteristic impedance $Z_0$ and is connected to a semiconductor chip, whereby electric defects caused by mismatching of the characteristic impedance $Z_0$ can be decreased.

(3) High-speed electronic device:

Since the semiconductor chip and the printed wiring board are connected by the short component mounting pin, it is possible to provide high-speed electronic devices.

(4) Excellent power supply to respective circuit elements of an electronic device:

Since the semiconductor chip and the printed wiring board are connected by the component mounting pin with low electric resistance, it is possible to prevent useless voltage drop from being caused when the power is supplied to respective circuit elements of the electronic device. As the component mounting pin with low electric resistance, there can be used a component mounting pin made of Cu, Au, Ag or any alloy thereof or a component mounting pin that is surface-finished by these metals.

(5) High-speed signal transmission:

Since the semiconductor chip and the printed wiring board are connected by the component mounting pin erected upward in the air, high-speed signal transmission becomes possible. More specifically, while a speed at which an electric signal is transmitted through a substrate such as a glass-epoxy substrate of which dielectric constant $\epsilon_r$ is greater than 1 is expressed as $v=c/(\epsilon_r)^{1/2}$(m/s), the above speed at which an electric signal is transmitted through the component mounting pin erected upward in the air can be considered as a speed substantially close to a speed in the vacuum and can be increased more as shown by an equation expressed as $v=c$(m/s).

(6) Excellent electric connection between the semiconductor chip and the printed wiring board:

In the electronic device 4 including the component mounting pin pressure contact mounting structure described with reference to FIG. 2, since the semiconductor chip and the printed wiring board are mechanically joined together under repulsive force of the component mounting pin, it is possible to obtain electric connection in a state in which contact resistance is relatively low.

(7) Applicable to relatively large printed wiring boards:

In the electronic device 4 including the component mounting pin pressure contact mounting structure described with reference to FIG. 2, electric connection between the semiconductor chip and the printed wiring board can be maintained by urging the printed wiring board against the semiconductor chip. Accordingly, it is possible to realize the electronic device including the component mounting pin pressure contact mounting structure by even a printed wiring board that may warp relatively much, such as a coreless substrate without core substrate and a substrate with a thin core substrate.

(8) Easy modification and easy repair:

In the electronic device 4 including the component mounting pin pressure contact mounting structure described with reference to FIG. 2, since the semiconductor chip and the printed wiring board are not connected by soldering, the semiconductor chip and the printed wiring board can be separated with ease in a work such as modification and repair.

(9) Printed wiring board free from damage due to heat:

In the electronic device 4 including the component mounting pin pressure contact mounting structure described with reference to FIG. 2, since the semiconductor chip and the printed wiring board are not connected by soldering, thermal budget such as reflow process can be prevented from being left on the printed wiring board. That is, the printed wiring board can be protected from being damaged due to heat.

(10) High-density pattern of printed wiring board:

In the electronic device 4 including the component mounting pin pressure contact mounting structure described with reference to FIG. 2, thermal budget such as reflow process is not left on the printed wiring board. Also, the printed wiring board can be protected from being damaged due to heat and the pattern of the printed wiring board can be increased in density (pattern of the printed wiring board can be made fine).

More specifically, a reflow temperature is the highest temperature in temperatures at which the printed wiring board is exposed, and various restrictions are imposed on the printed wiring board from a design standpoint so that the printed wiring board can cope with stress upon reflow. For example, a build-up printed wiring board needs a conductor roughing treatment process to increase a bottom diameter of a via hole greater than a predetermined value (e.g. greater than 60 µm) or to increase a thickness of a conductive layer greater than a predetermined value (e.g. greater than 2 µm) in order to maintain the insulating layer and the conductive layer closely contacted with each other. However, when the reflow process becomes unnecessary, the above-mentioned restrictions can be removed and the diameter of the via hole can be reduced more. Also, since the conductor roughing treatment can be made more delicate, the pattern of the printed wiring board can be increased in density or the conductor roughing treatment can be removed (i.e. conductor surface is smooth).

[The Others]

While the embodiments of the printed wiring board with the component mounting pin and the electronic device using the same have been described so far, these embodiments are described by way of example and the present invention is not limited thereto.

Addition, deletion, improvement and the like that can be made by those skilled in the art may be included in the scope of the present invention.

The technical scope of the present invention is determined by the description of the appended claims.

It should be understood by those skilled in the art that various modifications, combinations, sub-combinations and alterations may occur depending on design requirements and other factors insofar as they are within the scope of the appended claims or the equivalents thereof.

What is claimed is:

1. A printed wiring board comprising:
a multilayer board having an inner conductive layer, an outermost conductor layer electrically connected to said inner conductive layer, and a solder resist layer formed over the outermost conductor layer and having an opening to expose a portion of the outermost conductor layer; and
a component mounting pin protruding from said board, the component mounting pin comprising a plurality of discrete conductive layers each having substantially planar opposing face surfaces and an edge surface joining the opposing face surfaces, wherein a first layer of the plurality of discrete layers comprises an integral metal structure filling the opening and extending along a surface of the solder resist layer, and wherein adjacent layers of said plurality of discrete layers have contacting face surfaces in contact with one another.

2. A printed wiring board according to claim 1,
wherein said component mounting pin is elongated from said outermost conductor of said printed wiring board and an end thereof is erected from said printed wiring board.

3. A printed wiring board according to claim 1,
wherein said component mounting pin comprises an elastic material.

4. A printed wiring board according to claim 1,
wherein said component mounting pin comprising:

said first layer being a first copper plating layer, which expands with tensile stress, and
a second copper plating layer adjacent to the first copper plating layer and which contracts with compressive stress.

5. A printed wiring board according to claim 1,
wherein said component mounting pin comprises one or more materials selected from a group consisting of a metal, a conductive rubber, a partly-conductive rubber, a conductive synthetic resin and a partly-conductive synthetic resin.

6. A printed wiring board according to claim 1,
wherein said plurality of layers comprise n layers (n>2), a first layer expressed as n=1 being directly opposed to said board and easy to expand relative to an nth layer not directly opposing said board.

7. A printed wiring board according to claim 1,
wherein said component mounting pin comprises a conductive protective coating formed thereon.

8. A printed wiring board according to claim 1,
wherein said component mounting pin comprises a solder bump formed at a tip end portion of the component mounting pin.

9. The printed wiring board of claim 1, wherein each of said plurality of planar layers is a planar layer that is curved by at least one of tensile stress or compressive stress.

10. A printed wiring board according to claim 6,
wherein an n−1th layer provides tensile stress relative to stress of said nth layer or provides equal stress to the stress of said nth layer, and said first layer provides tensile stress relative to the stress of said nth layer.

11. A printed wiring board according to claim 6,
wherein said n−1th layer has a coefficient of thermal expansion equal to or higher than a coefficient of thermal expansion of said nth layer, and said first layer has a coefficient of thermal expansion higher than the coefficient of thermal expansion of said nth layer.

12. An electronic device comprising:
a multilayer printed wiring board having an inner conductive layer, an outermost conductor layer electrically connected to said inner conductive layer, and a solder resist layer formed over the outermost conductor layer and having an opening to expose a portion of the outermost conductor layer;
a component mounting pin protruding from the printed wiring board, the component mounting pin comprising a plurality of discrete conductive layers each having substantially planar opposing face surfaces and an edge surface joining the opposing face surfaces, wherein a first layer of the plurality of discrete layers comprises an integral metal structure filling the opening and extending along a surface of the solder resist layer, and wherein adjacent layers of said plurality of discrete layers have contacting face surfaces in contact with one another; and
a surface-mounting type component with an electrode pad, wherein said component mounting pin is electrically connected to said electrode pad.

13. An electronic device according to claim 12, wherein said component mounting pin has elasticity and is urged against said electrode pad.

14. An electronic device according to claim 12,
wherein said component mounting pin is short in length.

15. An electronic device according to claim 12,
wherein said component mounting pin is elongated from an outermost conductor of said printed wiring board, erected upward and connected to said electrode pad and the portion which is erected upward is exposed to the air.

16. The electronic device of claim 12, where said edge surface of each of said layers is not in contact with an adjacent one of said layers.

17. The electronic device of claim 12, where each of said plurality of planar layers is a planar layer that is curved by at least one of tensile stress or compressive stress.

18. An electronic device comprising:
a multilayer printed wiring board having an inner conductive layer, an outermost conductor layer electrically connected to said inner conductive layer, and a solder resist layer formed over the outermost conductor layer and having an opening to expose a portion of the outermost conductor layer;
a component mounting pin protruding from the printed wiring board, the component mounting pin comprising a plurality of discrete conductive layers each having substantially planar opposing face surfaces and an edge surface joining the opposing face surfaces, wherein a first layer of the plurality of discrete layers comprises an integral metal structure filling the opening and extending along a surface of the solder resist layer, and wherein adjacent layers of said plurality of discrete layers have contacting face surfaces in contact with one another; and
a surface-mounting type component with an electrode pad, wherein said component mounting pin has a solder bump formed at a tip end portion of the component mounting pin and is soldered to said electrode pad.

19. The printed wiring board of claim 1, wherein said edge surface of each of said layers is not in contact with an adjacent one of said layers.

20. The electronic device of claim 18, where said edge surface of each of said layers is not in contact with an adjacent one of said layers.

* * * * *